(12) United States Patent
Liu

(10) Patent No.: US 12,100,594 B2
(45) Date of Patent: Sep. 24, 2024

(54) ACTIVE REGION ARRAY FORMATION METHOD

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 455 days.

(21) Appl. No.: 17/595,589

(22) PCT Filed: Mar. 12, 2021

(86) PCT No.: PCT/CN2021/080332
§ 371 (c)(1),
(2) Date: Nov. 19, 2021

(87) PCT Pub. No.: WO2021/208649
PCT Pub. Date: Oct. 21, 2021

(65) Prior Publication Data
US 2022/0230881 A1 Jul. 21, 2022

(30) Foreign Application Priority Data
Apr. 17, 2020 (CN) .......................... 202010303267.3

(51) Int. Cl.
*H01L 21/033* (2006.01)
*H01L 21/265* (2006.01)
(Continued)

(52) U.S. Cl.
CPC ...... *H01L 21/0338* (2013.01); *H01L 21/0335* (2013.01); *H01L 21/0337* (2013.01);
(Continued)

(58) Field of Classification Search
CPC ............. H01L 21/0338; H01L 21/0335; H01L 21/0337; H01L 21/26513; H01L 21/266
See application file for complete search history.

(56) References Cited

U.S. PATENT DOCUMENTS

| 10,529,579 B2 | 1/2020 | Lupo |
| 2011/0177518 A1 | 7/2011 | Kartalov et al. |
| 2013/0196477 A1 | 8/2013 | Kang |

FOREIGN PATENT DOCUMENTS

| CN | 101106109 A | 1/2008 |
| CN | 103247577 A | 8/2013 |

(Continued)

OTHER PUBLICATIONS

International Search Report as cited in PCT Application No. PCT/CN2021/080332 mailed Jun. 2, 2021, 8 pages.
(Continued)

*Primary Examiner* — Victor A Mandala
*Assistant Examiner* — Colleen E Snow
(74) *Attorney, Agent, or Firm* — Kilpatrick Townsend & Stockton LLP

(57) ABSTRACT

An active region array formation method is provided, including: providing a substrate, and forming a first hard mask layer on a surface of the substrate; patterning the first hard mask layer by using a composite etching process to form an active region shielding layer in the first hard mask layer, a pattern of the active region shielding layer being matched with a pattern of a to-be-formed active region array, wherein the composite etching process includes at least two patterning processes and at least one pattern transfer process; removing the remaining first hard mask layer; and forming the active region array in the substrate through the active region shielding layer.

13 Claims, 16 Drawing Sheets

(51) Int. Cl.
*H01L 21/266* (2006.01)
*H10B 12/00* (2023.01)

(52) U.S. Cl.
CPC ...... *H01L 21/26513* (2013.01); *H01L 21/266* (2013.01); *H10B 12/00* (2023.02)

(56) References Cited

FOREIGN PATENT DOCUMENTS

| | | |
|---|---|---|
| CN | 107946232 A | 4/2018 |
| CN | 208738216 U | 4/2019 |
| CN | 110943045 A | 3/2020 |

OTHER PUBLICATIONS

Written Opinion cited in PCT/CN2021/080332, mailed on Jun. 2, 2021, 6 pages.

A-A

B-B

C-C

B-B

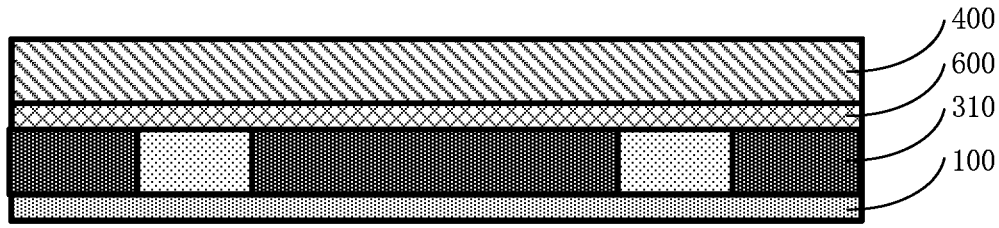

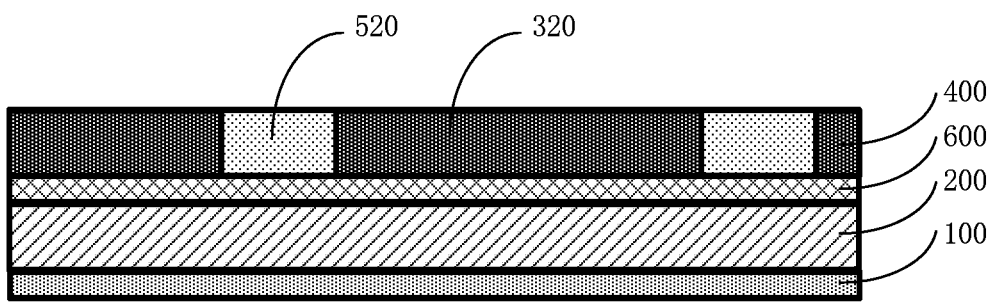

FIG. 29

Remove the second shielding layer, and etch the first hard mask layer onto the surface of the substrate through the pattern of the second shielding layer to form a shielding layer transfer trench — S231

Fill the shielding layer transfer trench with the first material to form a transfer shielding layer — S232

Remove the transfer shielding layer and the second hard mask layer on the surface of the first hard mask layer, the remaining transfer shielding layer and the first shielding layer constituting the active region shielding layer together — S233

FIG. 30

ACTIVE REGION ARRAY FORMATION METHOD

CROSS-REFERENCE TO RELATED APPLICATIONS

This application claims priority to Chinese Application No. 202010303267.3, filed on Apr. 17, 2020 and entitled "ACTIVE REGION ARRAY FORMATION METHOD," the disclosure of which is incorporated herein by reference in its entirety.

TECHNICAL FIELD

The present invention relates to an active region array formation method.

BACKGROUND

With the continuous development of science and technology, people have increasingly high requirements on semiconductor technologies. A semiconductor memory is a memory that is accessed by a semiconductor circuit; in particular, a Dynamic Random Access Memory (DRAM) is widely used in various fields due to its high storage speed and high integration.

SUMMARY

According to various embodiments, a first aspect of the present application provides an active region array formation method, including:

providing a substrate, and forming a first hard mask layer on a surface of the substrate;

patterning the first hard mask layer by using a composite etching process to form an active region shielding layer in the first hard mask layer, a pattern of the active region shielding layer being matched with a pattern of a to-be-formed active region array, wherein the composite etching process includes at least two patterning processes and at least one pattern transfer process;

removing the remaining first hard mask layer; and forming the active region array in the substrate through the active region shielding layer.

Details of one or more embodiments of the present application are set forth in the following accompanying drawings and descriptions. Other features and advantages of the present application become obvious with reference to the specification, the accompanying drawings and the claims.

BRIEF DESCRIPTION OF DRAWINGS

In order to more clearly illustrate the technical solutions in embodiments of the present application, the accompanying drawings used in the description of the embodiments will be briefly introduced below. It is apparent that, the accompanying drawings in the following description are only some embodiments of the present application, and other drawings can be obtained by those of ordinary skill in the art from the provided drawings without creative efforts.

FIG. 27 to FIG. 29 are schematic cross-sectional views of the device structure according to the embodiment of FIG. 26;

FIG. 30 is a sub-flowchart of step S230 according to an embodiment;

Figure 1:
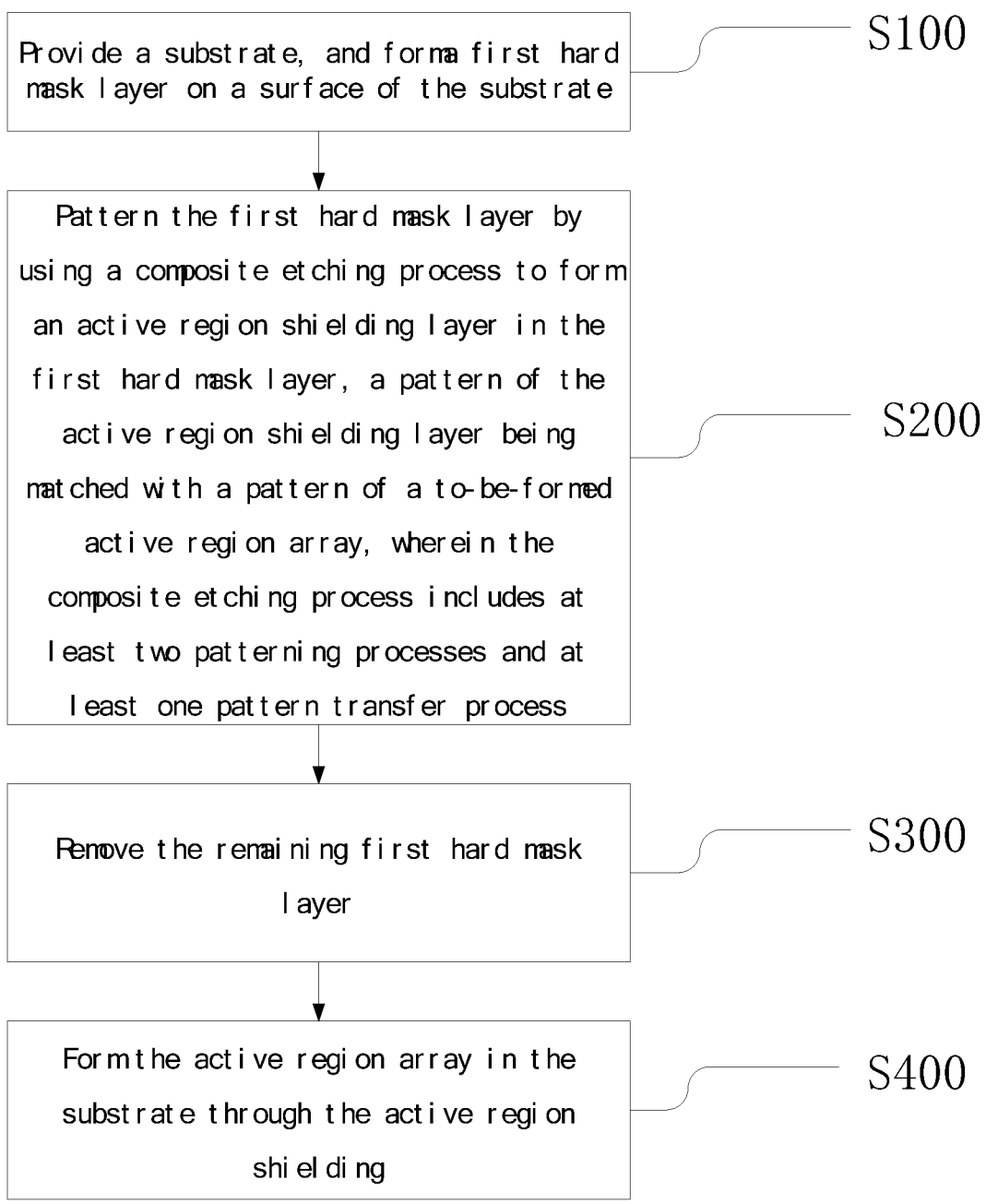
FIG. 1 shows an active region array formation method according to an embodiment.

REFERENCE NUMERALS substrate: 100; first hard mask layer: 200; active region shielding layer: 300; first shielding layer: 310; first initial shielding layer: 311; first filling trench: 312; second shielding layer: 320; second initial shielding layer: 321; second filling trench: 322; second hard mask layer: 400; spacer filling layer: 500; first spacer layer: 510; second spacer layer: 520; sacrificial layer: 600.

DESCRIPTION OF EMBODIMENTS

A dynamic random access memory includes a plurality of repeating storage units. With the continuous reduction in a volume of a device to which the dynamic random access memory is applied, higher requirements are also put on the volume of the dynamic random access memory. A minimum process size of a fabrication device greatly limits a minimum volume of the memory. For example, structural defects easily occur during the fabrication of an active region of a transistor of a small memory. As a result, a fabrication yield of a highly integrated memory cannot meet rapidly developing fabrication demands.

To facilitate the understanding of the present invention, a more comprehensive description of the present invention will be given below with reference to the relevant accompanying drawings. Preferred embodiments of the present invention are given in the drawings. However, the present invention may be implemented in many different forms and is not limited to the embodiments described herein. Rather, these embodiments are provided to make the contents disclosed in the present invention more fully understood.

Unless defined otherwise, all technical and scientific terms used herein have the same meanings as are commonly understood by those skilled in the art. The terms used herein in the specification of the present invention are for the purpose of describing specific embodiments only but not intended to limit the present invention. The term "and/or" used herein includes any and all combinations of one or more related listed items.

In the description of the present invention, it should be understood that the orientation or position relationship indicated by the terms "upper", "lower", "vertical", "horizontal", "inner", "outer", etc. are based on the orientation or position relationship shown in the accompanying drawings and are intended to facilitate the description of the present invention and simplify the description only, rather than indicating or implying that the apparatus or element referred to must have a particular orientation or be constructed and operated in a particular orientation, and therefore are not to be interpreted as limiting the present invention.

FIG. 1 is an active region array formation method according to an embodiment. As shown in FIG. 1, in this embodiment, the active region array formation method includes steps S100 to S400.

In S100, a substrate 100 is provided, and a first hard mask layer 200 is formed on a surface of the substrate 100.

Specifically, the substrate 100 may be made of silicon-on-insulator (SOI), bulk silicon or the like. The first hard mask layer 200 may be made of at least one of silicon nitride, silicon oxynitride, silicon oxycarbide, silicon carbonitride, metal nitride, metal oxide and metal carbide. In one example, the first hard mask layer 200 is made of silicon nitride. The silicon nitride material is low-cost, is mature in fabrication method, and has a higher etching selectivity ratio to the substrate 100. An etching effect is better when the substrate 100 is etched through the first hard mask layer 200.

In S200, the first hard mask layer 200 is patterned by using a composite etching process to form an active region shielding layer 300 in the first hard mask layer 200, and a pattern of the active region shielding layer 300 is matched with a pattern of a to-be-formed active region array, wherein the composite etching process includes at least two patterning processes and at least one pattern transfer process.

Specifically, each patterning process includes a lithography process and an etching process. The lithography process refers to forming a photoresist layer, exposing the photoresist layer through a photomask, so that a photoresist in an exposed region is decomposed or cross-linked, and then developing the photoresist layer, so as to form a patterned photoresist layer. The etching process refers to treating a to-be-etched film by using gas or liquid, so as to pattern the to-be-etched film, wherein the to-be-etched film may be a substrate, a hard mask layer, or the like. The pattern transfer process refers to an operation of transferring a pattern formed in a second film into a first film, wherein the first film and the second film are two adjacent films, and the second film is formed on a surface of the first film. In this embodiment, a material in a set region of the first hard mask layer 200 is removed through a composite etching process, and a material of the active region shielding layer 300 is deposited in the set region, so as to form the active region shielding layer 300.

In S300, the remaining first hard mask layer 200 is removed.

Specifically, the remaining first hard mask layer 200 refers to the patterned first hard mask layer 200. After the remaining first hard mask layer 200 is removed, only the active region shielding layer 300 is retained on the surface of the substrate 100, so as to define a position of the active region array according to the active region shielding layer 300 to form the active region array in a subsequent step.

In S400, the active region array is formed in the substrate 100 through the active region shielding layer 300.

The active region array formation method according to this embodiment includes steps S100 to S400. A pattern of a to-be-formed active region shielding layer 300 is divided, part of the active region shielding layer 300 after division is formed by using at least two patterning processes, and part of the active region shielding layer 300 formed in different layers stepwise is combined and transferred into the first hard mask layer 200, so as to effectively avoid various defects easy to occur when dense patterns are formed simultaneously in the first hard mask layer 200, thereby reducing fabrication difficulty of the active region array and improving a fabrication yield of the memory.

Figure 2:
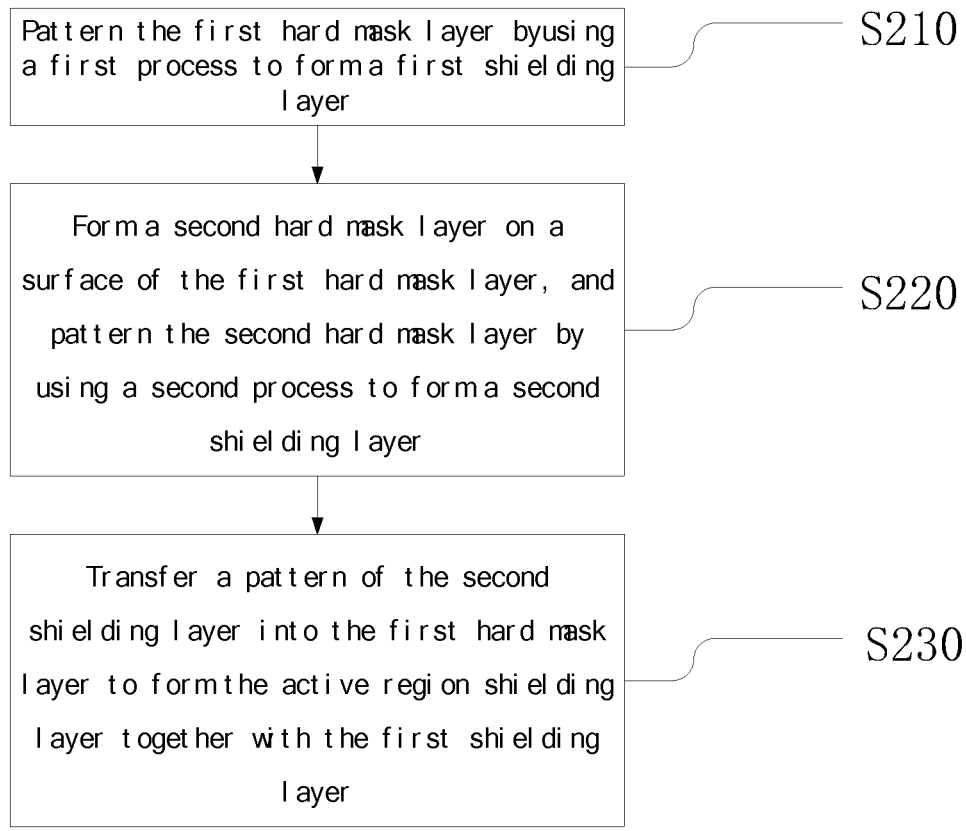
FIG. 2 is a sub-flowchart of step S200 according to an embodiment.

FIG. 2 is a sub-flowchart of step S200 according to an embodiment. As shown in FIG. 2, in this embodiment, step S200 includes sub-steps S210 to S230.

In S210, the first hard mask layer 200 is patterned by using a first process to form a first shielding layer 310.

In S220, a second hard mask layer 400 is formed on a surface of the first hard mask layer 200, and the second hard mask layer 400 is patterned by using a second process to form a second shielding layer 320.

In S230, a pattern of the second shielding layer 320 is transferred into the first hard mask layer 200 to form the active region shielding layer 300 together with the first shielding layer 310.

Figure 3:
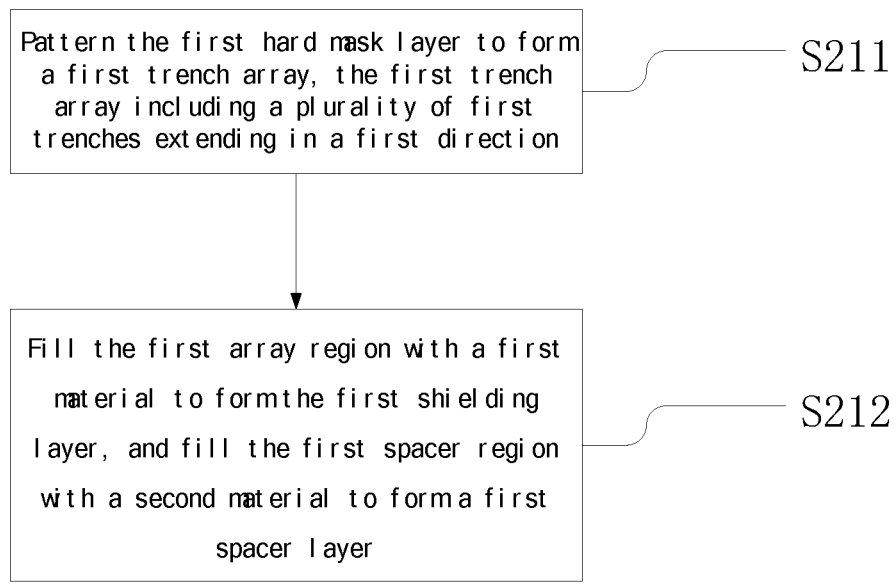
FIG. 3 is a sub-flowchart of step S210 according to an embodiment.

FIG. 3 is a sub-flowchart of step S210 according to an embodiment. As shown in FIG. 3, in this embodiment, step S210 includes sub-steps S211 to S212.

In S211, the first hard mask layer 200 is patterned to form a first trench array, the first trench array including a plurality of first trenches extending in a first direction; wherein each first trench is provided with a plurality of first array regions and a plurality of first spacer regions, and one first spacer region is arranged between two first array regions arranged adjacently in the first direction.

In one example, step S211 includes sub-steps S2111 to S2113.

In S2111, a first photoresist layer is formed on the surface of the first hard mask layer 200.

In S2112, the first photoresist layer is patterned.

In S2113, the first hard mask layer 200 is etched onto the surface of the substrate 100 through the patterned first photoresist layer to form the first trench array.

Specifically, the first photoresist layer is formed on the surface of the first hard mask layer 200 through a process such as spin coating, the first photoresist layer is patterned through exposure and development processes to form a pattern of the first trench array in the first photoresist layer, and the patterned first photoresist layer is used as a mask to etch the first hard mask layer 200 downward to the surface of the substrate 100 to remove a region of the first hard mask layer 200 exposed by the first photoresist layer, that is, a pattern region of the first trench array, so as to form the first trench array in the first hard mask layer 200.

Further, the first trench array may be formed through Self-aligned Double Patterning (SADP); that is, after the completion of one lithography, a lithography pattern is processed through a process such as thin film deposition or etching to achieve a purpose of reducing a line width of the lithography pattern and increasing the density of the lithography pattern. For example, if a feature size of a lithography machine is 20 nm, a lithography pattern with a minimum line width of 10 nm can be formed through SADP, so as to achieve a purpose of improving device integration. Furthermore, other process technologies, such as self-aligned quadruple patterning, can also be used to further miniaturize the device.

In S212, the first array region is filled with a first material to form the first shielding layer 310, and the first spacer region is filled with a second material to form a first spacer layer 510.

Specifically, in each first trench, each first shielding region fits with the first spacer region adjacent thereto; that is, no gap exists between the first shielding region and the first spacer region. The first trench array is configured to be filled with different materials to form the first shielding layer 310 and the first spacer layer 510, and a pattern of the first shielding layer 310 can cover half of the pattern of the to-be-formed active region array.

Figure 4:
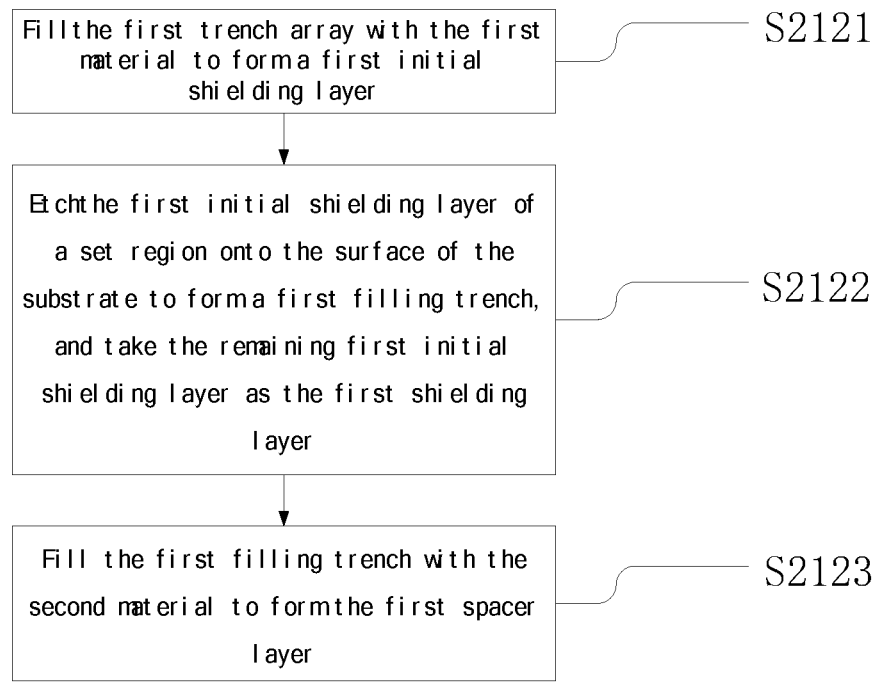
FIG. 4 is a sub-flowchart of step S212 according to an example.
Figure 5:
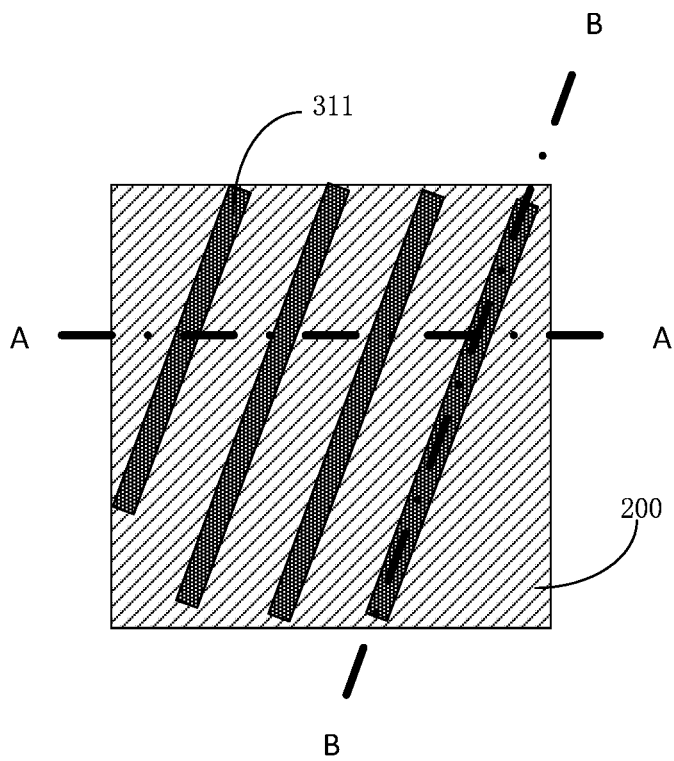
FIG. 5 is a schematic top view of a device structure after step S2121 according to an embodiment.

FIG. 4 is a sub-flowchart of step S212 according to an example. As shown in FIG. 4, in this example, step S212 includes sub-steps S2121 to S2123. FIG. 5 is a schematic top view of a device structure after step S2121 according to an embodiment, FIG. 6 to FIG. 7 are schematic cross-sectional views of the device structure according to the embodiment of FIG. 5, FIG. 8 is a schematic top view of a device structure after step S2122 according to an embodiment, FIG. 9 to FIG. 10 are schematic cross-sectional views of the device structure according to the embodiment of FIG. 8, FIG. 11 is a schematic top view of a device structure after step S2123 according to an embodiment, and FIG. 12 to FIG. 13 are schematic cross-sectional views of the device structure according to the embodiment of FIG. 12.

Figure 6:
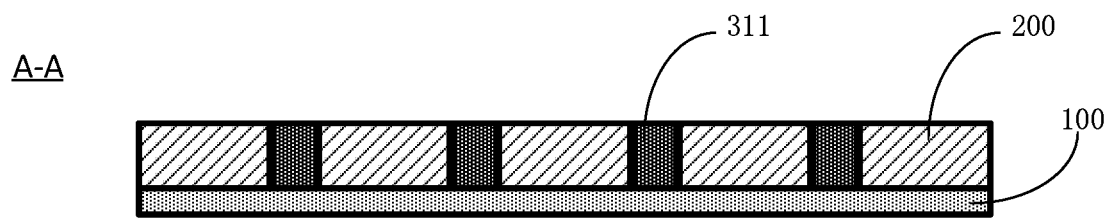
FIG. 6 to FIG. 7 are schematic cross-sectional views of the device structure according to the embodiment of FIG. 5.
Figure 7:
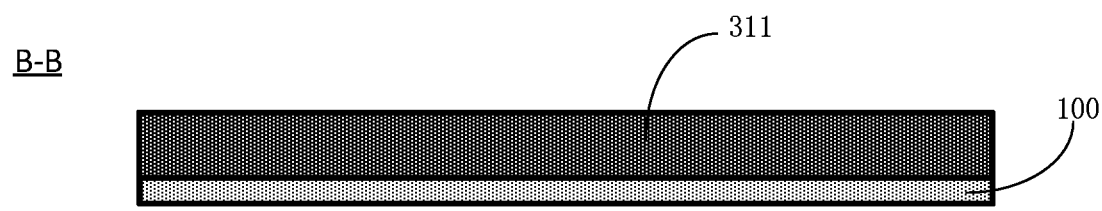

In S2121, the first trench array is filled with the first material to form a first initial shielding layer 311 (as shown in FIG. 5 to FIG. 7).

Figure 8:
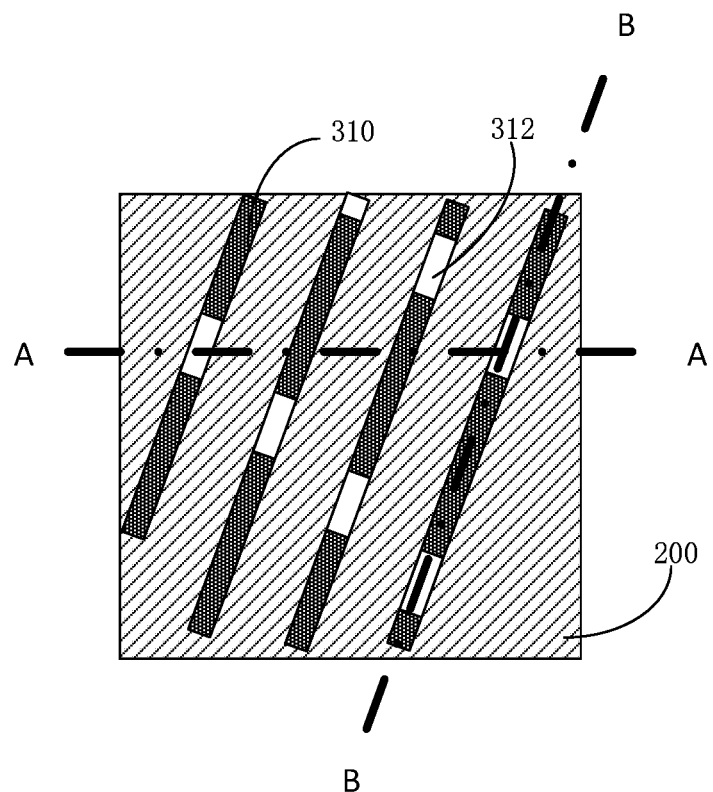
FIG. 8 is a schematic top view of a device structure after step S2122 according to an embodiment.
Figure 9:
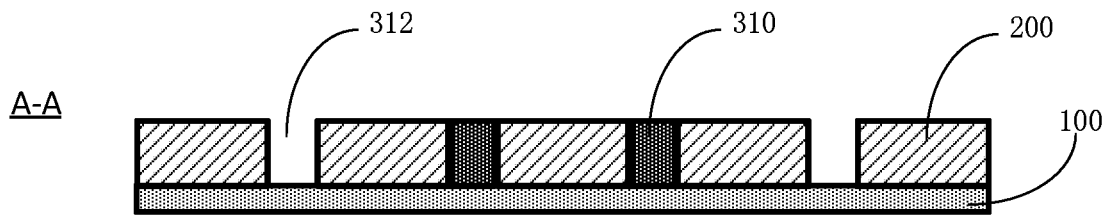
FIG. 9 to FIG. 10 are schematic cross-sectional views of the device structure according to the embodiment of FIG. 8.
Figure 10:
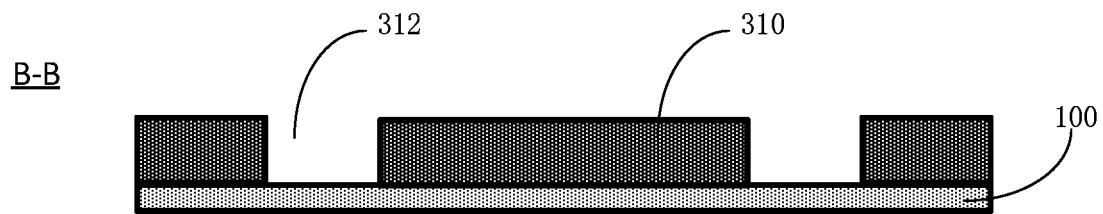

In S2122, the first initial shielding layer 311 of a set region is etched onto the surface of the substrate 100 to form a first filling trench 312, and the remaining first initial shielding layer 311 is taken as the first shielding layer 310 (as shown in FIG. 8 to FIG. 10).

Figure 11:
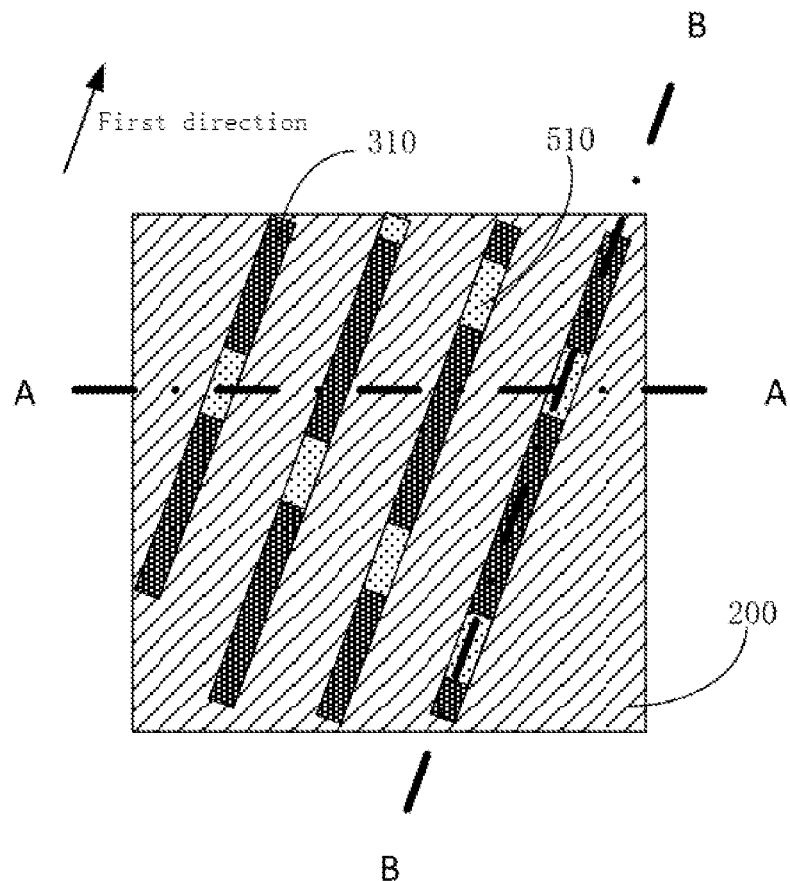
FIG. 11 is a schematic top view of a device structure after step S2123 according to an embodiment.
Figure 12:
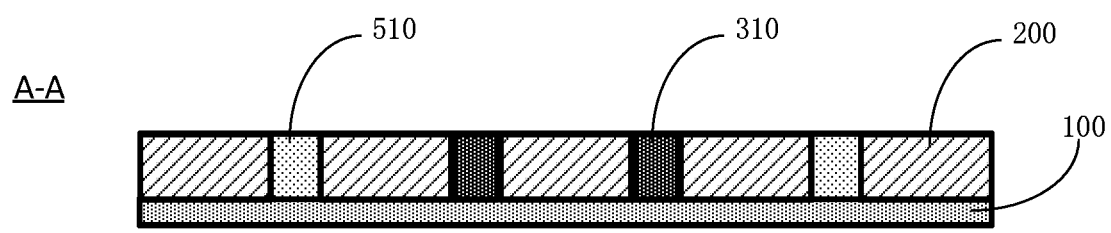
FIG. 12 to FIG. 13 are schematic cross-sectional views of the device structure according to the embodiment of FIG. 12.
Figure 13:
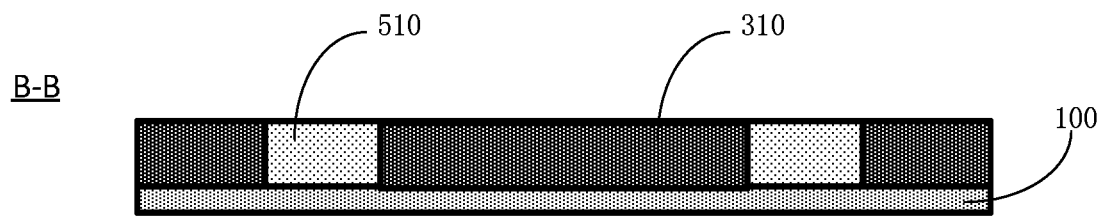

In S2123, the first filling trench 312 is filled with the second material to form the first spacer layer 510 (as shown in FIG. 11 to FIG. 13).

Further, the first shielding layer 310 includes a plurality of first shielding units arranged in an array, and the first spacer layer 510 includes a plurality of first spacer units arranged in an array. As shown in FIG. 11, in this example, since a width of the first shielding unit in the first direction is greater than that of the first spacer unit in the first direction, the first material required to be etched away in step S2122 is reduced, and the second material needed for filling in step S2123 is also reduced correspondingly. Therefore, the etching time of the first initial shielding layer 311 and the filling material of the first spacer layer 510 can be reduced with the formation method according to this example, so as to save time and material costs of fabrication of the device. In other examples, if the width of the first shielding unit in the first direction is less than or equal to that of the first spacer unit in the first direction, the first shielding layer 310 and the first spacer layer 510 can be formed by using a method of first filling the first trench array with the second material to perform etching and then filling the first trench array with the first material.

Figure 14:
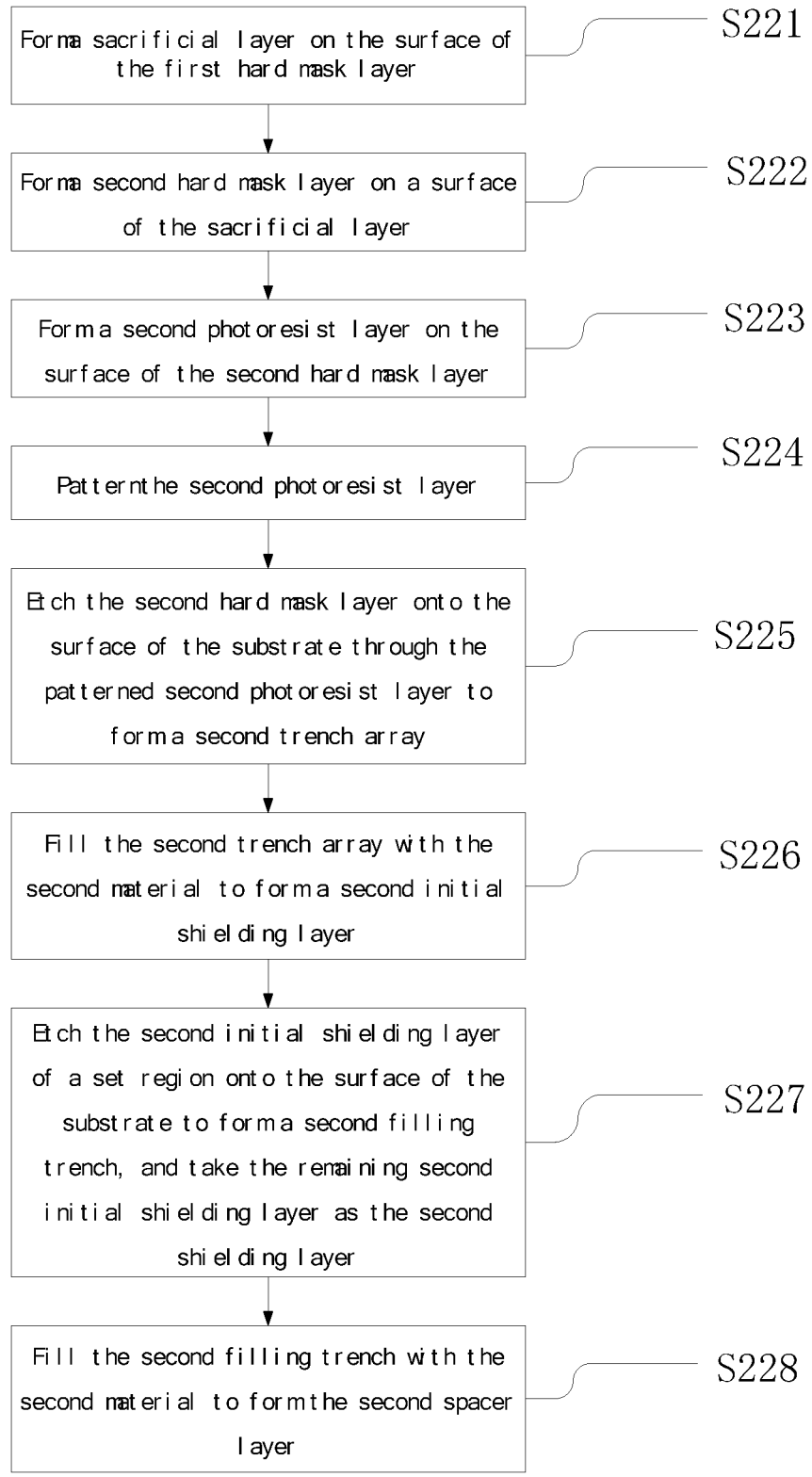
FIG. 14 is a sub-flowchart of step S220 according to an embodiment.

FIG. 14 is a sub-flowchart of step S200 according to an embodiment. As shown in FIG. 14, in this embodiment, step S220 includes sub-steps S221 to S228.

The step of forming a second hard mask layer 400 on a surface of the first hard mask layer 200 includes sub-steps S221 to S222.

In S221, a sacrificial layer 600 is formed on the surface of the first hard mask layer 200.

In S222, a second hard mask layer 400 is formed on a surface of the sacrificial layer 600.

Figure 15:
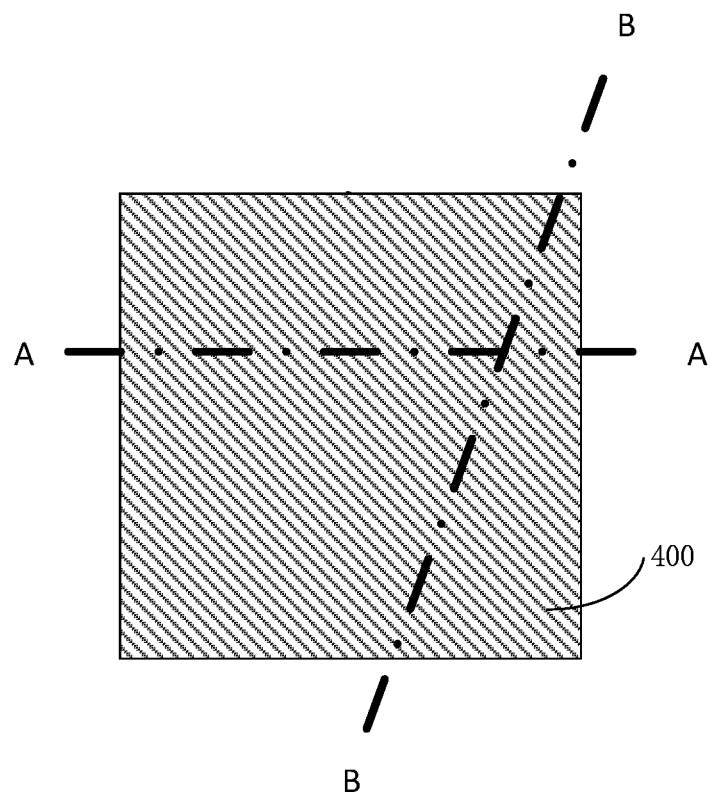
FIG. 15 is a schematic top view of a device structure after step S222 according to an embodiment.
Figure 16:
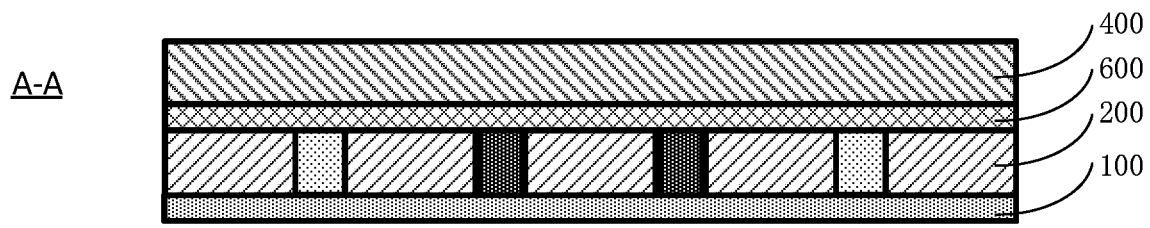
FIG. 16 to FIG. 17 are schematic cross-sectional views of the device structure according to the embodiment of FIG. 15.
Figure 17:
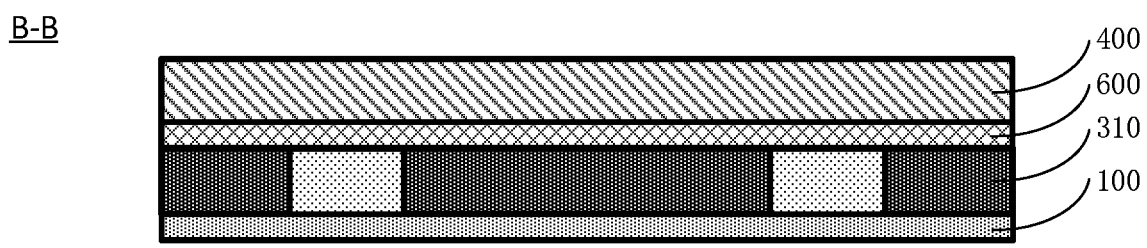

Specifically, FIG. 15 is a schematic top view of a device structure after step S222 according to an embodiment, and FIG. 16 to FIG. 17 are schematic cross-sectional views of the device structure according to the embodiment of FIG. 15. In this embodiment, the sacrificial layer 600 may be formed through a process such as spin coating, chemical vapor deposition or physical vapor deposition. The sacrificial layer 600 covers the first hard mask layer 200 and the first shielding layer 310 and the first spacer layer 510 that are formed in the first hard mask layer 200. The sacrificial layer 600 has a larger etching selectivity ratio to other films. Therefore, the sacrificial layer 600 further acts as an etching stop layer for the etching of the second hard mask layer 400 to prevent damages caused by the etching process to the first hard mask layer 200, the first shielding layer 310 and the first spacer layer 510. Compared with the method of directly forming the second hard mask layer 400 on the surface of the first hard mask layer 200, better fabrication accuracy and reliability can be realized in this embodiment by arranging the sacrificial layer 600. Optionally, the sacrificial layer 600 may be made of silicon oxide, silicon nitride, silicon oxynitride, fluoride-doped silicate glass (FSG), or the like.

The step of patterning the second hard mask layer 400 by using a second process to form a second shielding layer 320 includes sub-steps S223 to S228.

In S223, a second photoresist layer is formed on the surface of the second hard mask layer 400.

In S224, the second photoresist layer is patterned.

In S225, the second hard mask layer 400 is etched onto the surface of the substrate 100 through the patterned second photoresist layer to form the second trench array.

Specifically, the second photoresist layer may be made of a same material as the first photoresist layer, with lithographic steps and lithographic parameters the same as those of the first photoresist layer. The method of forming the second trench array through steps S223 to S225 is similar to the method of forming the first trench array through steps S2111 to S2113, which is not described in detail herein. Projections of the first trench array and the second trench array on the substrate 100 do not overlap. In this embodiment, the to-be-formed active region array is divided into two parts that are formed in the first hard mask layer 200 and the second hard mask layer 400 respectively, so as to achieve a purpose of reduce the difficulty of the fabrication process and improve the fabrication precision and yield of the device. In other embodiments, if distribution density of the active regions in the to-be-formed active region array is higher, the to-be-formed active region array may also be divided into multiple parts that are formed in multiple hard mask layers respectively and are finally transferred to a same hard mask layer through a pattern transfer process, so as to further reduce the difficulty of the fabrication process.

In S226, the second trench array is filled with the second material to form a second initial shielding layer 321 (as shown in FIG. 18 to FIG. 21).

In S227, the second initial shielding layer 321 of a set region is etched onto the surface of the substrate 100 to form a second filling trench 322, and the remaining second initial shielding layer 321 is taken as the second shielding layer 320 (as shown in FIG. 22 to FIG. 25).

In S228, the second filling trench 322 is filled with the second material to form the second spacer layer 520 (as shown in FIG. 26 to FIG. 29).

Figure 18:
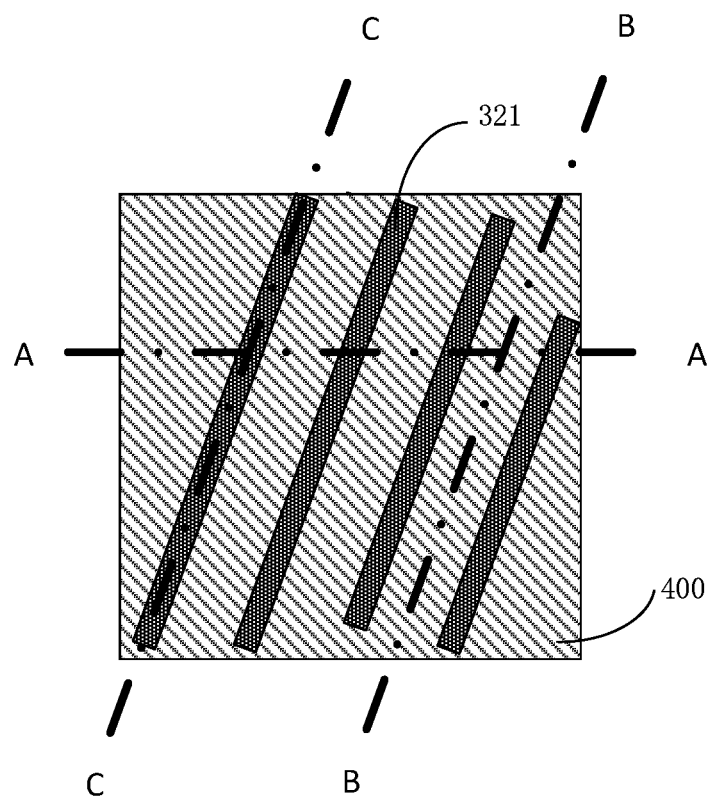
FIG. 18 is a schematic top view of a device structure after step S226 according to an embodiment.
Figure 19:
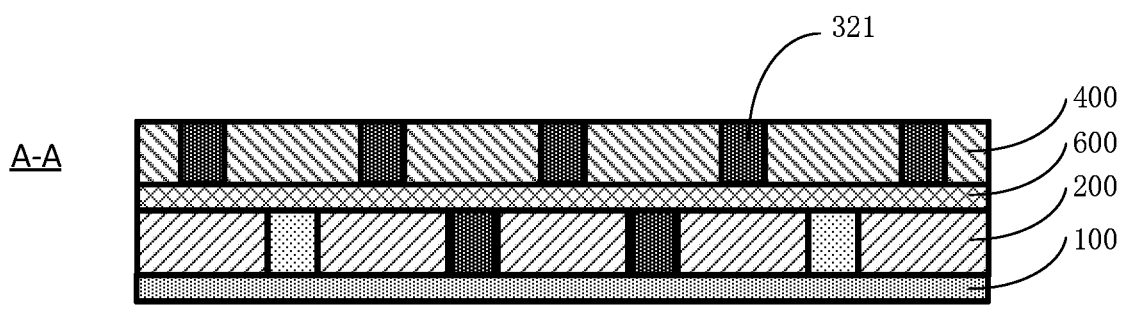
FIG. 19 to FIG. 21 are schematic cross-sectional views of the device structure according to the embodiment of FIG. 18.
Figure 20:
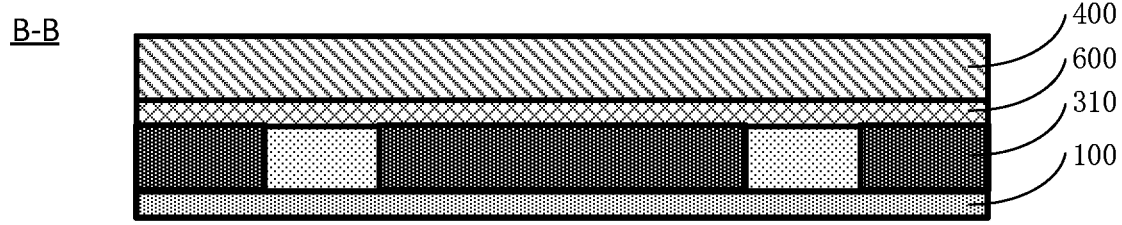
Figure 21:
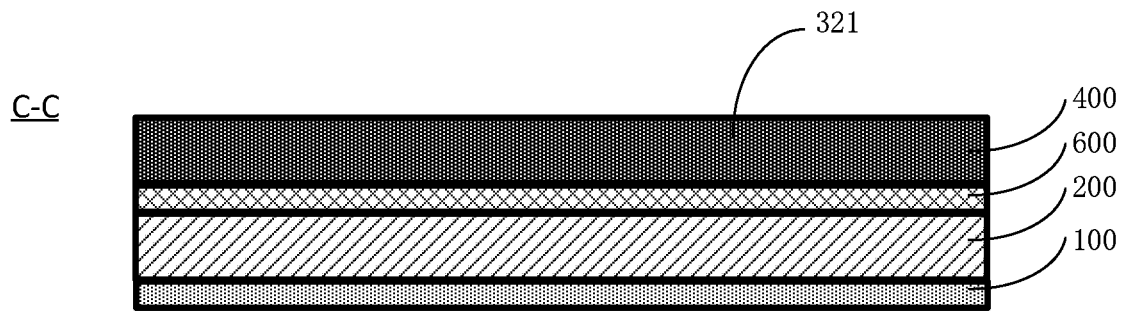
Figure 22:
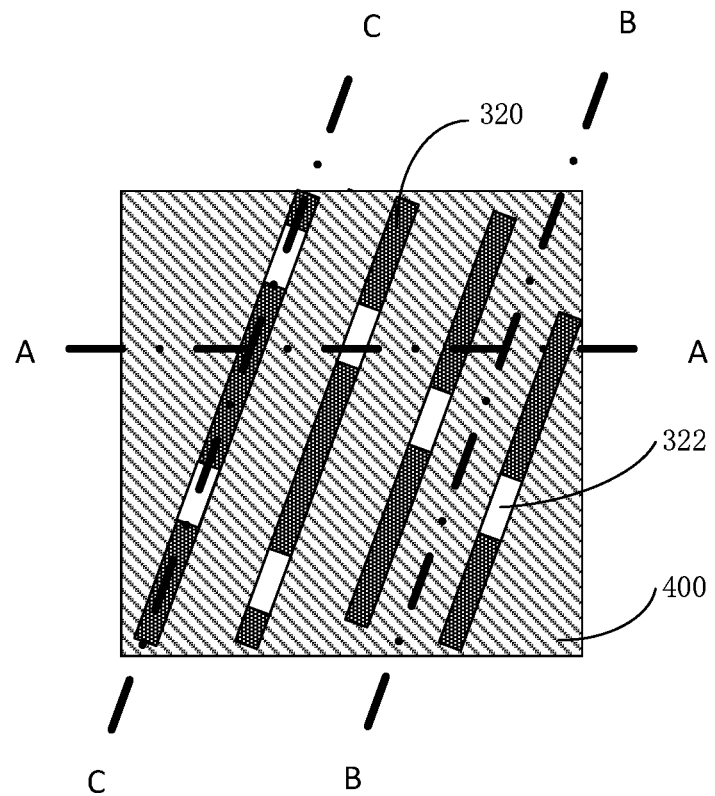
FIG. 22 is a schematic top view of a device structure after step S227 according to an embodiment.
Figure 23:
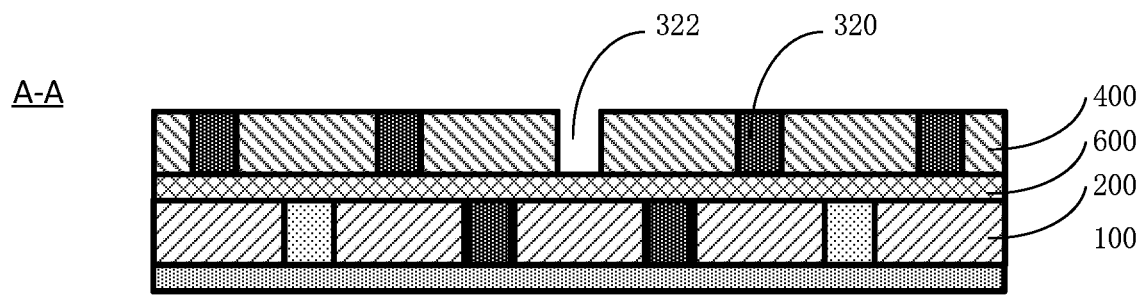
FIG. 23 to FIG. 25 are schematic cross-sectional views of the device structure according to the embodiment of FIG. 22.
Figure 24:
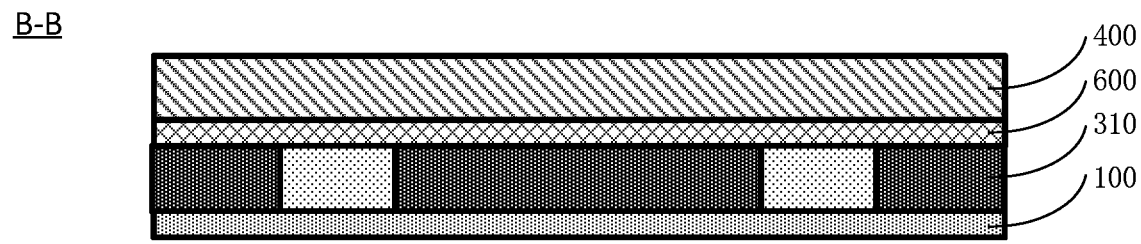
Figure 25:
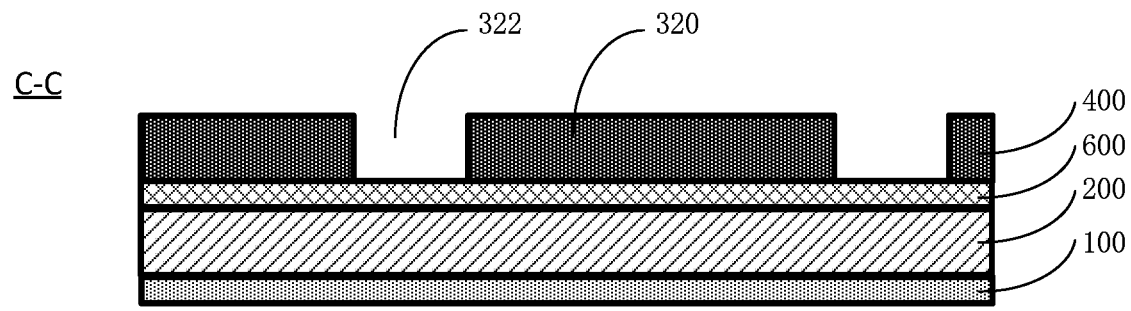
Figure 26:
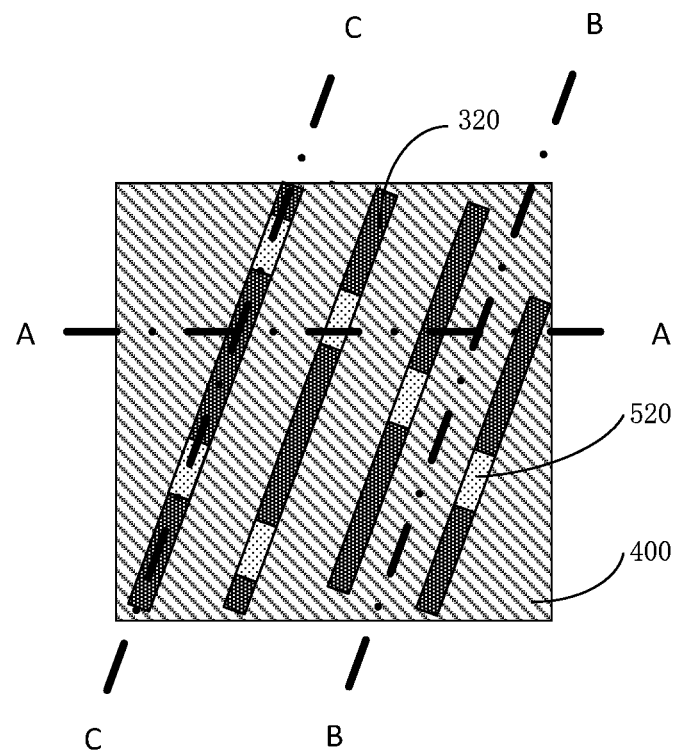
FIG. 26 is a schematic top view of a device structure after step S228 according to an embodiment.
Figure 27:
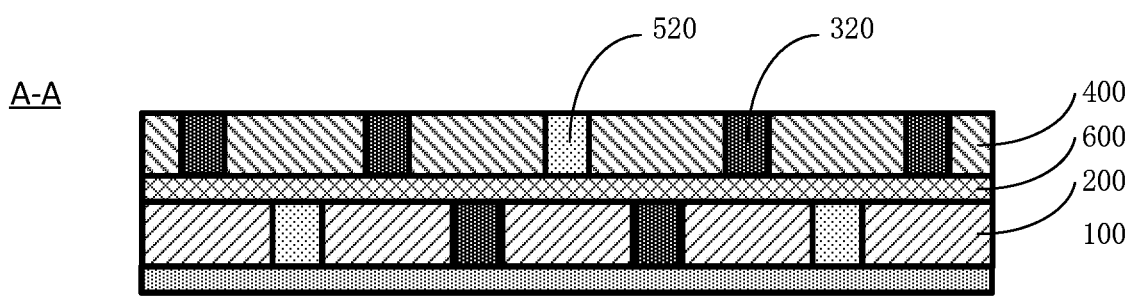

Specifically, FIG. 18 is a schematic top view of a device structure after step S226 according to an embodiment, FIG. 19 to FIG. 21 are schematic cross-sectional views of the device structure according to the embodiment of FIG. 18, FIG. 22 is a schematic top view of a device structure after step S227 according to an embodiment, FIG. 23 to FIG. 25 are schematic cross-sectional views of the device structure according to the embodiment of FIG. 22, FIG. 26 is a schematic top view of a device structure after step S228 according to an embodiment, and FIG. 27 to FIG. 29 are schematic cross-sectional views of the device structure according to the embodiment of FIG. 26. In this embodiment, the method of forming the second shielding layer 320 and the second spacer layer 520 through steps S226 to S228 is similar to the method of forming the first shielding layer 310 and the first spacer layer 510 through steps S2121 to S2123, which is not described in detail herein. In this embodiment, projections of the first shielding layer 310 and the second shielding layer 320 on the substrate 100 do not overlap and cover the pattern of the to-be-formed active region array together, so as to form the active region array in the substrate 100 through subsequent steps.

In S230, a pattern of the second shielding layer 320 is transferred into the first hard mask layer 200 to form the active region shielding layer 300 together with the first shielding layer 310.

Figure 31:
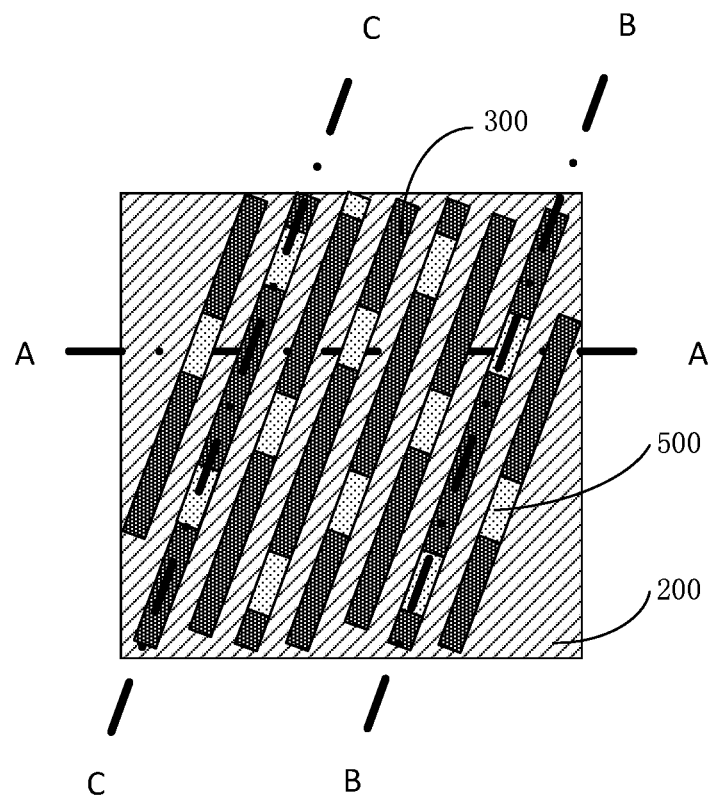
FIG. 31 is a schematic top view of a device structure after step S230 according to this embodiment.
Figure 32:
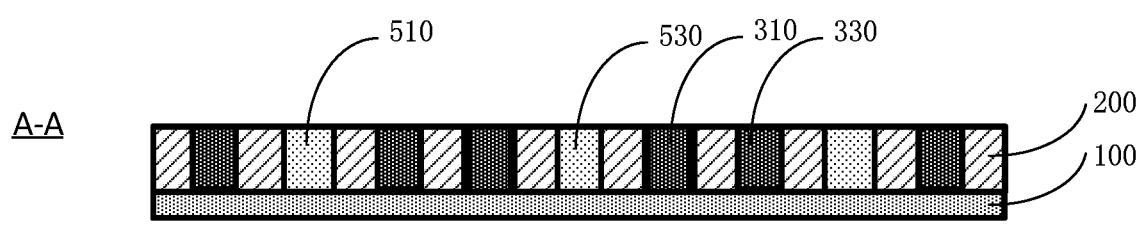
FIG. 32 to FIG. 34 are schematic cross-sectional views of the device structure according to the embodiment of FIG. 31.
Figure 33:
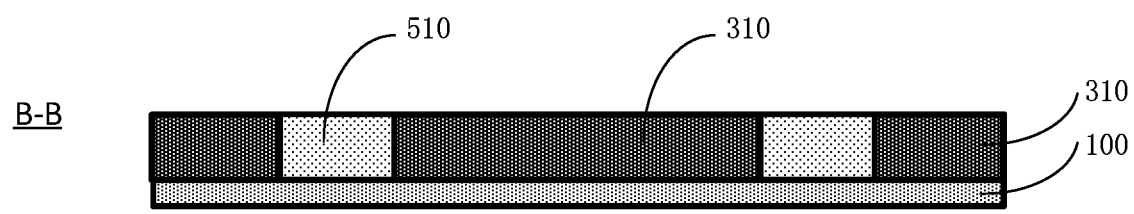
Figure 34:
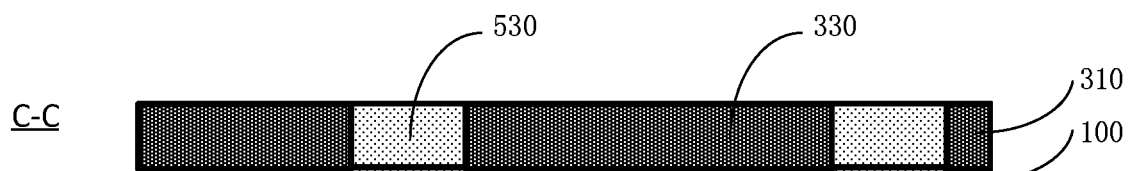

FIG. 30 is a sub-flowchart of step S230 according to an embodiment; as shown in FIG. 30, in this embodiment, step S230 includes sub-steps S231 to S233. FIG. 31 is a schematic top view of a device structure after step S230 according to this embodiment, and FIG. 32 to FIG. 34 are schematic cross-sectional views of the device structure according to the embodiment of FIG. 31.

In S231, the second shielding layer 320 is removed, and the first hard mask layer 200 is etched onto the surface of the substrate 100 through the pattern of the second shielding layer 320 to form a shielding layer transfer trench.

In S232, the shielding layer transfer trench is filled with the first material to form a transfer shielding layer 330.

In S233, the transfer shielding layer 330 and the second hard mask layer 400 on the surface of the first hard mask layer 200 are removed, the remaining transfer shielding layer 330 and the first shielding layer 310 constitute the active region shielding layer 300 together.

Specifically, as shown in FIG. 32, the remaining transfer shielding layer 330 refers to the transfer shielding layer 330 remaining in the first hard mask layer. In this embodiment, it is set that the transfer shielding layer 330 is made of a same material as the first shielding layer 310, so that the active region shielding layer 300 constituted by the first shielding layer 310 and the transfer shielding layer 330 together can be removed simultaneously through a one-step etching process in a subsequent step. Similarly, the transfer spacer layer 530 is also made of a same material as the first spacer layer 510, so that the transfer shielding layer 330 constituted by the first spacer layer 510 and the transfer spacer layer 530 together can be removed simultaneously through the one-step etching process. The method according to this embodiment can not only save the time of the etching process, more importantly, but also ensure a same etching rate at all positions of the active region shielding layer 300, so as to avoid performance differences of different transistor devices caused by different etching rates of different materials.

Further, when the second spacer layer 520 is further formed in the second hard mask layer 400, prior to the step of removing the transfer shielding layer 330 and the second hard mask layer 400 on the surface of the first hard mask layer 200, the method further includes the following steps.

In S234, the second spacer layer 520 is removed, and the first hard mask layer 200 is etched onto the surface of the substrate 100 through the pattern of the second spacer layer 520 to form a spacer layer transfer trench.

In S235, the spacer layer transfer trench is filled with the second material to form a transfer spacer layer 530.

In S236, the transfer spacer layer 530 on the surface of the first hard mask layer 200 is removed.

Figure 35:
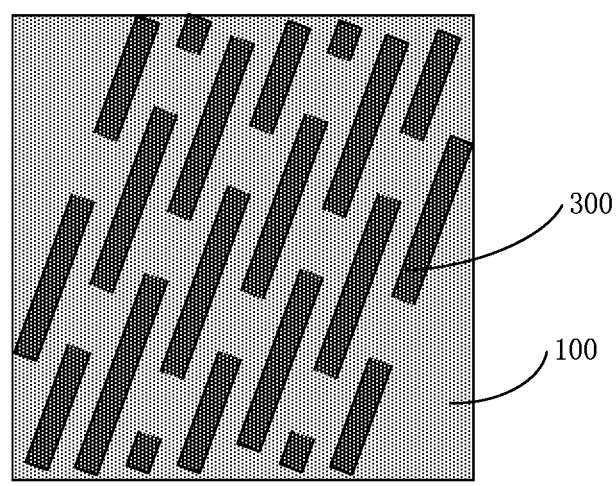
FIG. 35 is a schematic top view of a device structure after step S300 according to an embodiment.

FIG. 35 is a schematic top view of a device structure after step S300 of removing the remaining first hard mask layer 200 according to an embodiment. If the transfer spacer layer 530 is further formed on the surface of the substrate 100, that is, after the transfer spacer layer 530 is formed through the above steps S234 and S236 and the transfer spacer layer 530 on the surface of the first hard mask layer 200 is removed, the remaining transfer spacer layer 530 in the first hard mask layer 200 and the first spacer layer 510 constitute a spacer filling layer 500 together. Therefore, prior to step S400 of forming the active region array in the substrate 100 through the active region shielding layer 300, the method further includes removing the spacer filling layer 500, so as to retain only the active region shielding layer 300 on the surface of the substrate 100.

Figure 36:
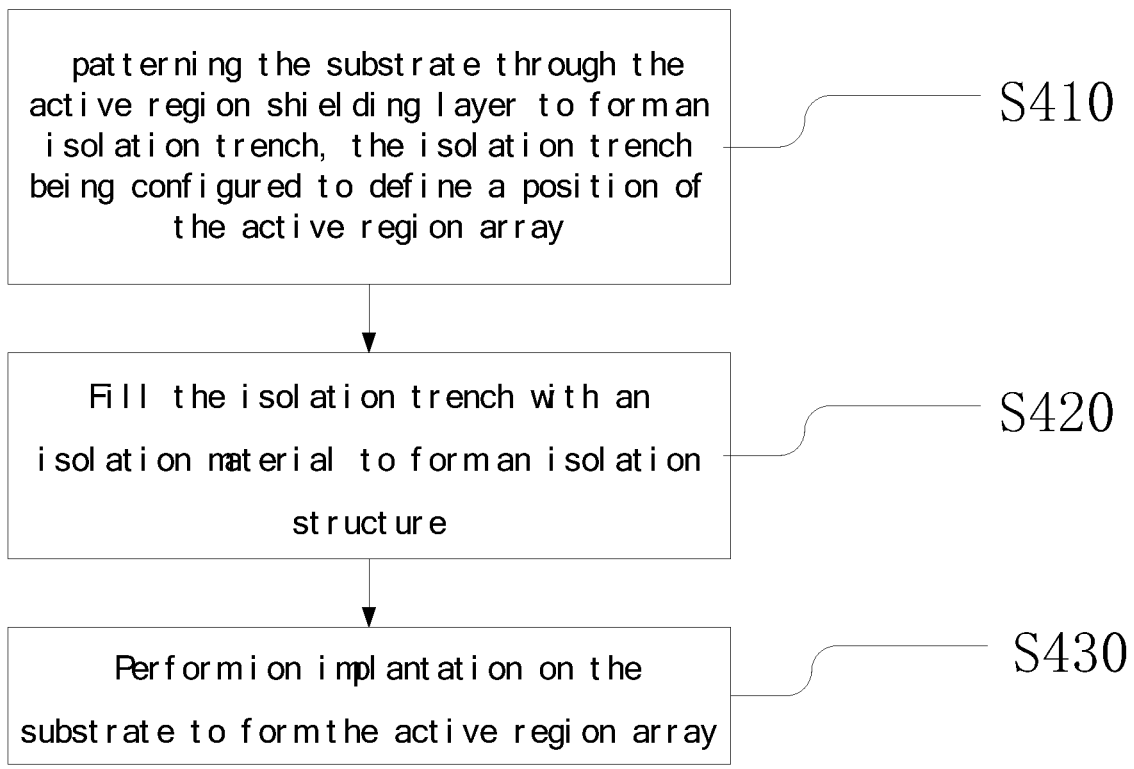
FIG. 36 is a sub-flowchart of step S400 according to an embodiment.

FIG. 36 is a sub-flowchart of step S400 according to an embodiment. As shown in FIG. 36, in this embodiment, step S400 includes sub-steps S410 to S430.

In S410, the substrate 100 is patterned through the active region shielding layer 300 to form an isolation trench, the isolation trench being configured to define a position of the active region array.

In S420, the isolation trench is filled with an isolation material to form an isolation structure.

Specifically, the trench is filled with dielectric; and a surface of a wafer is flattened by chemical mechanical polishing. The trench is filled with a dielectric material, such as silicon oxide, by chemical vapor deposition. A shallow groove isolation structure has a small surface area, is compatible with a chemical mechanical polishing technology, can be applied to a smaller line width and a higher integration level, and thus is a better isolation technology. It should be noted that the isolation structure in this embodiment is not limited to the shallow trench isolation structure, and other isolation structures that can achieve isolation performance are also available.

In S430, ion implantation is performed on the substrate 100 to form the active region array.

Specifically, an active region is formed by an ion implantation process further combined with a process such as annealing activation. A doping type of the active region is determined by a conductivity type of a to-be-formed transistor.

It should be understood that, although the steps in each flowchart are displayed in sequence as indicated by the arrows, the steps are not necessarily performed in the order indicated by the arrows. Unless otherwise clearly specified herein, the steps are performed without any strict sequence limitation, and may be performed in other orders. In addition, at least some steps in each flowchart may include a plurality of sub-steps or a plurality of stages, and these sub-steps or stages are not necessarily performed at a same moment, and may be performed at different moments. The sub-steps or stages are not necessarily performed in sequence, and the sub-steps or stages and at least some of other steps or sub-steps or stages of other steps may be performed repeatedly or alternately.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present invention, and their description is specific and detailed, but cannot therefore be understood as a limitation on the patent scope of the present invention. It should be noted that those of ordinary skill in the art may further make variations and improvements without departing from the conception of the present invention, and these all fall within the protection scope of the present invention. Therefore, the patent protection scope of the present invention should be subject to the appended claims.

What is claimed is:

1. An active region array formation method, comprising:
providing a substrate, and forming a first hard mask layer on a surface of the substrate;
patterning the first hard mask layer by using a composite etching process to form an active region shielding layer in the first hard mask layer, a pattern of the active region shielding layer being matched with a pattern of a to-be-formed active region array, wherein the composite etching process comprises at least two patterning processes and at least one pattern transfer process;
removing the remaining first hard mask layer; and
forming the active region array in the substrate through the active region shielding layer; and,
wherein patterning the first hard mask layer by using the composite etching process to form the active region shielding layer in the first hard mask layer comprises:
patterning the first hard mask layer by using a first process to form a first shielding layer;
forming a second hard mask layer on a surface of the first hard mask layer, and patterning the second hard mask layer by using a second process to form a second shielding layer; and
transferring a pattern of the second shielding layer into the first hard mask layer to form the active region shielding layer together with the first shielding layer,
wherein projections of the first shielding layer and the second shielding layer on the substrate do not overlap.

2. The active region array formation method according to claim 1, wherein the step of patterning the first hard mask layer by using a first process to form a first shielding layer comprises:

patterning the first hard mask layer to form a first trench array, the first trench array comprising a plurality of first trenches extending in a first direction; wherein each first trench is provided with a plurality of first array regions and a plurality of first spacer regions, and one first spacer region is arranged between two first array regions arranged adjacently in the first direction; and
filling the first array region with a first material to form the first shielding layer, and filling the first spacer region with a second material to form a first spacer layer.

3. The active region array formation method according to claim 2, wherein the step of filling the first array region with a first material to form the first shielding layer, and filling the first spacer region with a second material to form a first spacer layer comprises:
filling the first trench array with the first material to form a first initial shielding layer;
etching the first initial shielding layer of a set region onto the surface of the substrate to form a first filling trench, and taking the remaining first initial shielding layer as the first shielding layer; and
filling the first filling trench with the second material to form the first spacer layer.

4. The active region array formation method according to claim 2, wherein the step of patterning the first hard mask layer to form a first trench array comprises:
forming a first photoresist layer on the surface of the first hard mask layer;
patterning the first photoresist layer; and
etching the first hard mask layer onto the surface of the substrate through the patterned first photoresist layer to form the first trench array.

5. The active region array formation method according to claim 2, wherein the step of patterning the second hard mask layer by using a second process to form a second shielding layer comprises:
forming a second photoresist layer on the surface of the second hard mask layer;
patterning the second photoresist layer;
etching the second hard mask layer onto the surface of the substrate through the patterned second photoresist layer to form a second trench array;
filling the second trench array with the second material to form a second initial shielding layer;
etching the second initial shielding layer of a set region onto the surface of the substrate to form a second filling trench, and taking the remaining second initial shielding layer as the second shielding layer; and
filling the second filling trench with the second material to form a second spacer layer.

6. The active region array formation method according to claim 1, wherein the step of forming a second hard mask layer on a surface of the first hard mask layer comprises:
forming a sacrificial layer on the surface of the first hard mask layer; and
forming a second hard mask layer on a surface of the sacrificial layer.

7. The active region array formation method according to claim 2, wherein the step of transferring a pattern of the second shielding layer into the first hard mask layer to form the active region shielding layer together with the first shielding layer comprises:
removing the second shielding layer, and etching the first hard mask layer onto the surface of the substrate through the pattern of the second shielding layer to form a shielding layer transfer trench;

filling the shielding layer transfer trench with the first material to form a transfer shielding layer; and removing the transfer shielding layer and the second hard mask layer on the surface of the first hard mask layer, the remaining transfer shielding layer and the first shielding layer constituting the active region shielding layer together.

8. The active region array formation method according to claim 7, wherein a second spacer layer is further formed in the second hard mask layer, and projections of the second spacer layer and the second shielding layer on the substrate do not overlap; and prior to the step of removing the transfer shielding layer and the second hard mask layer on the surface of the first hard mask layer, the method further comprises: removing the second spacer layer, and etching the first hard mask layer onto the surface of the substrate through the pattern of the second spacer layer to form a spacer layer transfer trench;

filling the spacer layer transfer trench with the second material to form a transfer spacer layer; and removing the transfer spacer layer on the surface of the first hard mask layer.

9. The active region array formation method according to claim 8, wherein after the step of removing the transfer spacer layer on the surface of the first hard mask layer, the remaining transfer spacer layer and the first spacer layer constitute a spacer filling layer together; and the step of forming the active region array in the substrate through the active region shielding layer further comprises:

removing the spacer filling layer.

10. The active region array formation method according to claim 1, wherein the step of forming the active region array in the substrate through the active region shielding layer comprises:

patterning the substrate through the active region shielding layer to form an isolation trench, the isolation trench being configured to define a position of the active region array;

filling the isolation trench with an isolation material to form an isolation structure; and performing ion implantation on the substrate to form the active region array.

11. The active region array formation method according to claim 2, wherein the first shielding layer comprises a plurality of first shielding units arranged in an array, and the first spacer layer comprises a plurality of first spacer units arranged in an array.

12. The active region array formation method according to claim 1, wherein the substrate is made of silicon-on-insulator or bulk silicon.

13. The active region array formation method according to claim 1, wherein the first hard mask layer is made of at least one of silicon nitride, silicon oxynitride, silicon oxycarbide, silicon carbonitride, metal nitride, metal oxide and metal carbide.

\* \* \* \* \*